US012334920B2

(12) United States Patent
Chuang et al.

(10) Patent No.: US 12,334,920 B2
(45) Date of Patent: Jun. 17, 2025

(54) LEVEL SHIFTER

(71) Applicant: Vanguard International Semiconductor Corporation, Hsinchu (TW)

(72) Inventors: Jung-Tsun Chuang, Tainan (TW); Shao-Chang Huang, Hsinchu (TW); Li-Fan Chen, Hsinchu (TW); Chun-Chih Chen, New Taipei (TW); Gong-Kai Lin, Yilan County (TW); Chien-Wei Wang, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 68 days.

(21) Appl. No.: 18/517,890

(22) Filed: Nov. 22, 2023

(65) Prior Publication Data

US 2025/0167785 A1 May 22, 2025

(51) Int. Cl.
*H03K 19/0185* (2006.01)

(52) U.S. Cl.
CPC ............................ *H03K 19/018521* (2013.01)

(58) Field of Classification Search
None
See application file for complete search history.

(56) References Cited

U.S. PATENT DOCUMENTS 10,256,820 B2 * 4/2019 Duby ............... H03K 3/356182
11,431,339 B1 * 8/2022 Ma ......................... H03K 3/037

* cited by examiner

*Primary Examiner* — Jeffrey S Zweizig
(74) *Attorney, Agent, or Firm* — Birch, Stewart, Kolasch & Birch, LLP

(57) ABSTRACT

A level shifter includes a level shifting circuit and a voltage tracking circuit. The level shifting circuit receives an input signal through an input terminal and converts the input signal from a first power domain to a second power domain to generate an output signal at an output terminal. The voltage tracking circuit is coupled to first and second voltage terminals, and tracks one with a lower level among voltages of the first and second voltage terminals to generate a control voltage. The level shifting circuit includes first and second N-type transistors. The first N-type transistor has a gate coupled to the input terminal, a drain coupled to a first node, and a source coupled to a ground. The second N-type transistor has a gate receiving the control voltage, a drain coupled to the output terminal at a second node, and a source coupled to the input terminal.

16 Claims, 4 Drawing Sheets

LEVEL SHIFTER

BACKGROUND OF THE INVENTION

Field of the Invention

The present invention relates to a level shifter, in particular to a level shifter without an input inverter.

Description of the Related Art

In a multi-power integrated circuit, a level shifter is required to convert signals from one power domain to another power domain. However, a conventional level shifter is provided with at least one inverter on the input side to invert an input signal and provide the inverted input signal to a gate of at least one pull-down N-type transistor on the low-voltage side. An inverter usually comprises a pair of an N-type transistor and a P-type transistor. Since an inverter that is provided on the input side is used to invert an input signal, the power domain of an N-type well region forming a P-type transistor in the inverter is the power domain of the input signal. A circuit for shifting levels comprises a plurality of pull-up P-type transistors on a high-voltage side, and the power domain of the N-type well region forming these P-type transistors is the power domain of an output signal. Therefore, a conventional level shifter requires two N-type well regions with different power domains, which increases the size of the level shifter.

BRIEF SUMMARY OF THE INVENTION

An exemplary embodiment of a level shifter is provided. The level shifter comprises a level shifting circuit and a voltage tracking circuit. The level shifting circuit receives an input signal through an input terminal and converts the input signal from a first power domain to a second power domain to generate an output signal at an output terminal. The voltage tracking circuit is coupled to a first voltage terminal and a second voltage terminal, and tracks one with a lower level among a first voltage of the first voltage terminal and a second voltage of the second voltage terminal to generate a control Voltage. The level shifting circuit comprises a first N-type transistor and a second N-type transistor. The first N-type transistor comprises a gate coupled to the input terminal, a drain coupled to a first node, and a source coupled to a ground. The second N-type transistor comprises a gate receiving the control voltage, a drain coupled to the output terminal at a second node, and a source coupled to the input terminal.

Another exemplary embodiment of a level shifter is provided. The level shifter comprises a level shifting circuit and a voltage tracking circuit. The level shifting circuit receives an input signal through an input terminal and converts the input signal from a first power domain to a second power domain to generate an output signal at an output terminal. The voltage tracking circuit is coupled to a first voltage terminal and a second voltage terminal, and tracks one with a lower level among of a first voltage of the first voltage terminal and a second voltage of the second voltage terminal to generate a control Voltage. The level shifting circuit comprises a first P-type transistor and a first N-type transistor. The first P-type transistor comprises a gate, a source coupled to the second voltage terminal, and a drain coupled to the output terminal at a first node. The first N-type transistor comprises a gate receiving a control voltage, a drain coupled to the first node, and a source coupled to the input terminal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
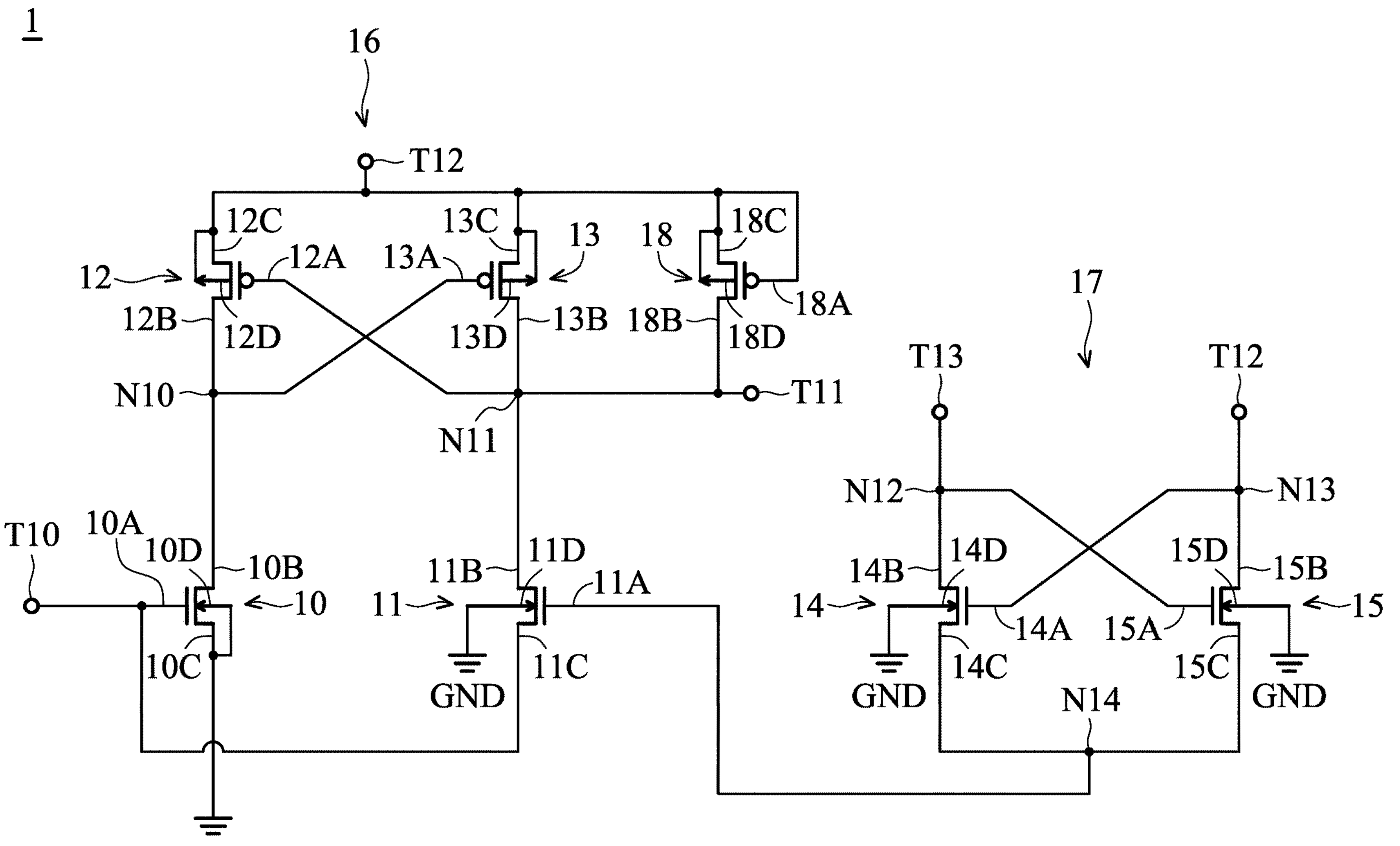
FIG. 1 shows an exemplary embodiment of a level shifter.

FIG. 1 shows an exemplary embodiment of a level shifter. Referring to FIG. 1, a level shifter 1 comprises a level shifting circuit 16 and a voltage tracking circuit 17. The level shifting circuit 16 is coupled to a voltage terminal T12 and a ground GND. The level shifting circuit 16 comprises an input terminal T10 and an output terminal T11. When the level shifting circuit 16 operates, the level shifting circuit 16 performed a level shifting operation on an input signal (shown in FIGS. 2-4) that is received through the input terminal T10 to generate a corresponding output signal (shown in FIGS. 2-4) at the output terminal T11. In detail, when the level shifting circuit 16 operates, an input signal that is received through the input terminal T10 is converted from one power domain to another power domain to generate a corresponding output signal (shown in FIGS. 2-4) at the output terminal T11.

Referring to FIG. 1, the level shifting circuit 16 comprises N-type transistors 10 and 11 and P-type transistors 12, 13, and 18. In the embodiment, the transistors 10-13 and 18 are implemented with metal-oxide-semiconductor (MOS) transistors. The N-type transistor 10 comprises a gate 10A, a drain 10B, a source 10C, and a bulk 10D. The gate 10A is coupled to the input terminal T10, the drain 10B is coupled to a node N10, the source 10C is coupled to the ground GND, and the bulk 10D is coupled to the ground GND. The N-type transistor 11 comprises a gate 11A, a drain 11B, a source 11C, and a bulk 11D. The gate 11A is coupled to the voltage tracking circuit 17 to receive a control voltage (shown in FIGS. 2-4) that is generated by the voltage tracking circuit 17, the drain 11B is coupled to the output terminal T11 is at the node N11, the source 11C is coupled to the input terminal T10, and the bulk 11D is coupled to the ground GND.

The P-type transistor 12 comprises a gate 12A, a drain 12B, a source 12C, and bulk 12D. The gate 12A is coupled to the node N11 (that is, coupled to the output terminal T11), the source 12C is coupled to the voltage terminal T12, the drain 12B is coupled to the node N10, and the bulk 12D is coupled to the voltage terminal T12. The P-type transistor 13 comprises a gate 13A, a drain 13B, a source 13C, and a bulk 13D. The gate 13A is coupled to the node N10, the source 13C is coupled to the voltage terminal T12, the drain 13B is coupled to the node N11, and the bulk 13D is coupled to the voltage terminal T12. The P-type transistor 18 comprises a gate 18A, a drain 18B, a source 18C, and a bulk 18D. The gate 18A is coupled to the voltage terminal T12, the source 18C is coupled to the voltage terminal T12, the drain 18B is coupled to the node N11, and the bulk 18D is coupled to the voltage terminal T12.

The voltage tracking circuit 17 is coupled to the voltage terminal T12 and further coupled to a voltage terminal T13. The voltage tracking circuit 17 tracks the voltage of the voltage terminal T12 or the voltage of the voltage terminal T13 whichever has a lower level to generate the control voltage. In the embodiment of the present invention, the voltage tracking circuit 17 comprises only N-type transistors and does not comprise any P-type transistors. Referring to FIG. 1, the voltage tracking circuit 17 comprises N-type transistors 14 and 15. In the embodiment, the transistors 14 and 15 are implemented with MOS transistors. The N-type transistor 14 comprises a gate 14A, a drain 14B, a source 14C, and a bulk 14D. The gate 14A is coupled to the voltage terminal T12 at a node N13, the drain 14B is coupled to the voltage terminal T13 at the node N12, the source 14C is coupled to a node N14, and the bulk 14D is coupled to the ground GND. The N-type transistor 15 comprises a gate 15A, a drain 15B, a source 15C, and a bulk 15D. The gate 15A is coupled to the node N12, the drain 15B is coupled to the node N13, the source 15C is coupled to the node N14, and the base 15D is coupled to the ground GND.

Referring to FIG. 1, the gate 11A of the N-type transistor 11 is coupled to the voltage tracking circuit 17 at the node N14. The voltage tracking circuit 17 generates the control voltage at the node N14. Therefore, the gate 11A receives the control voltage generated by the voltage tracking circuit 17 through the node N14.

The operation of the level shifter 1 in first to third modes will be explained below through FIGS. 2-4.

Figure 2:
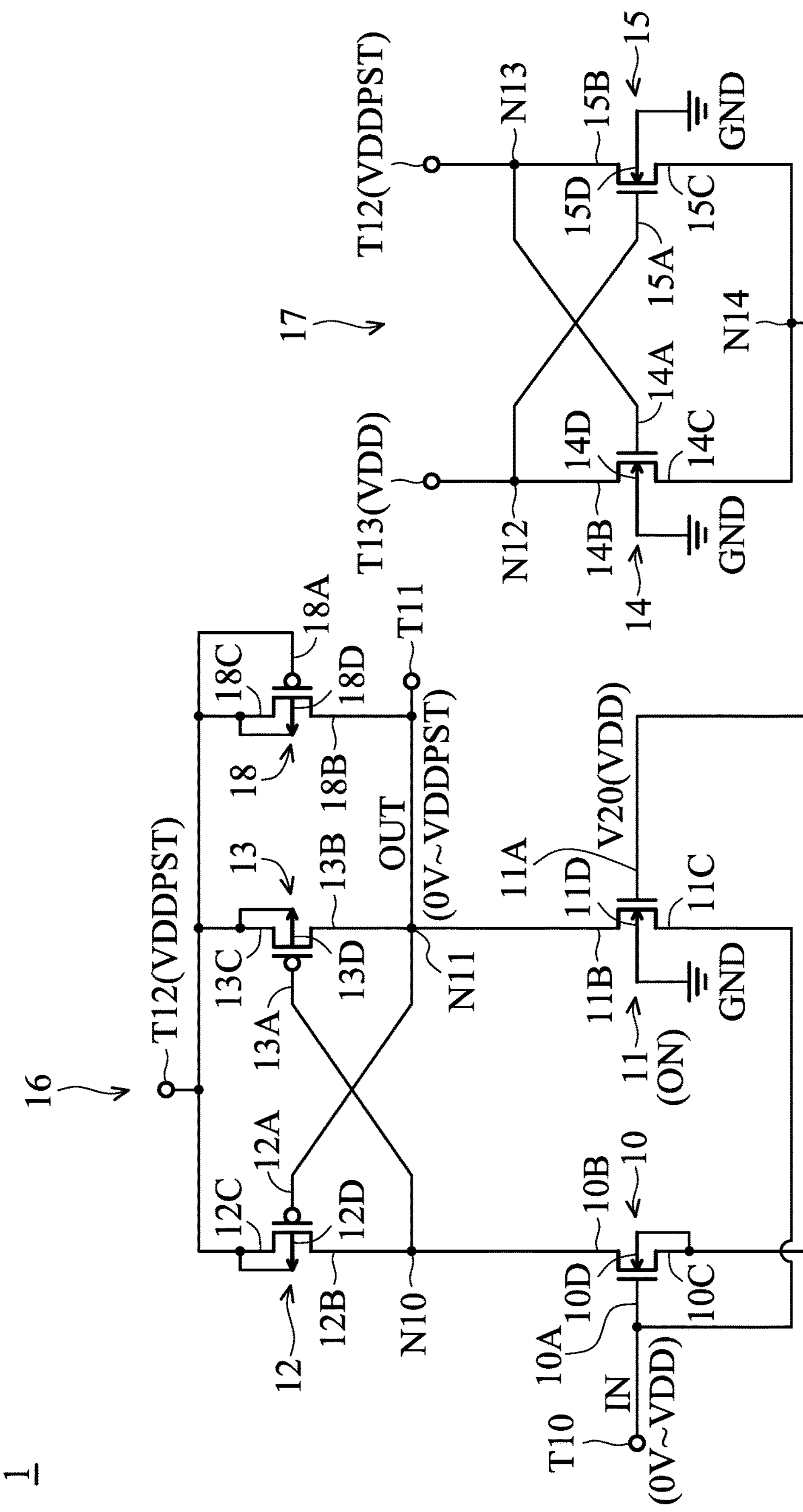
FIG. 2 is a schematic diagram showing an operation of a level shifter in a first mode according to an exemplary embodiment of the present invention.

Referring to FIG. 2, when the level shifter 1 operates in the first mode, the voltage terminal T12 receives a voltage (power voltage) VDDPST, and the voltage terminal T13 receives a voltage (power voltage) VDD. The voltage VDDPST is greater than the voltage VDD. In the embodiment, the voltage VDD is, for example, 1.8 volts (V), and the voltage VDDPST is, for example, 6V. In the voltage tracking circuit 17, both the N-type transistors 14 and 15 are turned on according to the voltages VDD and VDDPST. Since the voltage VDDPST (6V) is greater than the voltage VDD (1.8V), the N-type transistor 14 is easier to be turned on than the N-type transistor 15 so that a control voltage V20 at the node N14 is close to or equal to the voltage VDD (1.8V). Accordingly, the voltage tracking circuit 17 tracks the voltage VDD that has a lower level among the voltage VDDST (6V) at the voltage terminal T12 and the voltage VDD (1.8V) at the voltage terminal T13 to generate the control voltage V20 that is equal to the voltage VDD (1.8V).

The level shifting circuit 16 receives the input signal IN through the input terminal T10. The input signal IN is provided by a device or circuit in the power domain of voltage VDD (hereinafter referred to as the VDD power domain). The voltage level of the input signal IN is between 0V and 1.8V (the voltage VDD is 1.8V). When the input signal IN is at a voltage level of 0V, the N-type transistor 10 is turned off. Based on the control voltage V20 of 1.8V (VDD), the N-type transistor 11 is turned on (ON) so that the voltage at the node N11 is equal to the voltage (0V) of the input signal IN. According to the voltage of 0V at the node N11, the P-type transistor 12 is turned on so that the voltage at the node N10 is equal to the voltage VDDPST (6V). In response to the voltage of 6V at the node N10, the P-type transistor 13 is turned off. Moreover, the P-type transistor 18 is turned off according to the voltage VDDPST.

According to the above operation, the voltage at the node N11 is equal to the voltage (0V) of the input signal IN through the turned-on N-type transistor 11. Therefore, the output signal OUT of 0V is generated at the output terminal T11 coupled to the node N11. In this case, since both the P-type transistors 13 and 18 are in the turned-off state, the output signal OUT is stably at the voltage level of 0V along with the input signal IN.

In the first mode, when the input signal IN has a level of the voltage VDD (1.8V), the N-type transistor 10 is turned on. Through the turned-on N-type transistor 10, the voltage at the node N10 is equal to the voltage of the ground GND, for example, 0V. According to the voltage of 0V at the node N10, the P-type transistor 13 is turned on. At this time, since the control voltage V20 of 1.8V (VDD) is relatively low, it is difficult for the N-type transistor 11 to be turned on by the control voltage V20.

According to the above operation, through the turned-on P-type transistor 13, the voltage at the node N11 is equal to the voltage VDDPST (6V), and the output signal OUT of 6V is generated at the output terminal T11 coupled to the node N11. In this case, according to the voltage of 6V at the node N11, the P-type transistor 12 is turned off so that the node N10 is not affected by the voltage VDDPST and is stably at the voltage level of 0V. According to the above operation, the level shifting circuit 16 converts the input signal IN from the VDD power domain to the power domain of the voltage VDDPST (hereinafter referred to as the VDDPST power domain) to generate the output signal OUT of 0V at the output terminal T11, thereby completing the level shifting operation.

Figure 3:
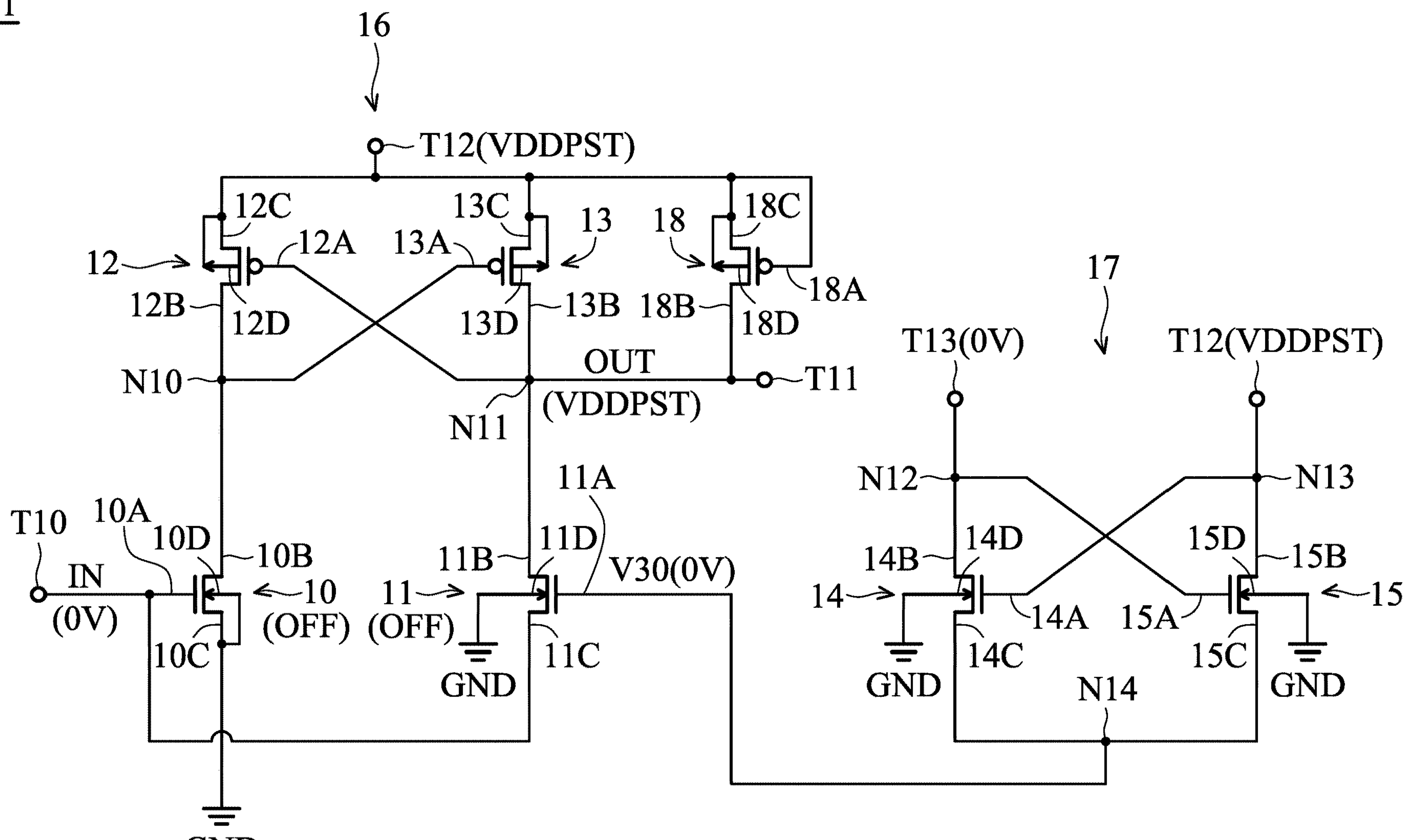
FIG. 3 is a schematic diagram showing an operation of a level shifter in a second mode according to an exemplary embodiment of the present invention.

Referring to FIG. 3, when the level shifter 1 operates in the second mode, the voltage terminal T12 receives the voltage VDDPST (6V), and the voltage terminal T13 receives the voltage of 0V. The case that the voltage terminal T13 receives a voltage of 0V indicates that the voltage terminal T13 does not receive the voltage VDD, in other words, the power supply of the device or circuit that generates the input signal IN is turned off. Thus, the voltage of 0V provided to the voltage terminal T13 is the turned-ff voltage corresponding to the turned-off state of the VDD power domain. The N-type transistor 14 is turned on according to the voltage VDDPST (6V), and the N-type transistor 15 is turned off according to the voltage of 0V. Through the turned-on N-type transistor 14, a control voltage V30 at the node N14 is close to or equal to 0V. Accordingly, the voltage tracking circuit 17 tracks the voltage of 0V that has a lower level among the voltage VDDST (6V) at the voltage terminal T12 and the voltages of 0V at the voltage terminal T13 to generate the control voltage V30 that is equal to 0V.

The level shifting circuit 16 receives the input signal IN through the input terminal T10. Since the power supply of the device or circuit that generates the input signal IN is turned off, the voltage level of the input signal IN is 0V to turn off (OFF) the N-type transistor 10. Based on the control voltage V30 of 0V, the N-type transistor 11 is turned off. At this time, node N11 is in a floating state. Subsequently, the node N11 is charged by the leakage currents flowing through the P-type transistors 13 and 18. The voltage at the node N11 is close to or equal to the voltage VDDPST (6V), and the output signal OUT of 6V is generated at the output terminal T11 coupled to the node N11. According to the above description, when the voltage terminal T13 does not receive the voltage VDD (in the second mode), the level shifter 1 generates the output signal OUT of 6V to prevent the output terminal T11 from being in a floating state and causing faulty operations circuits.

Figure 4:
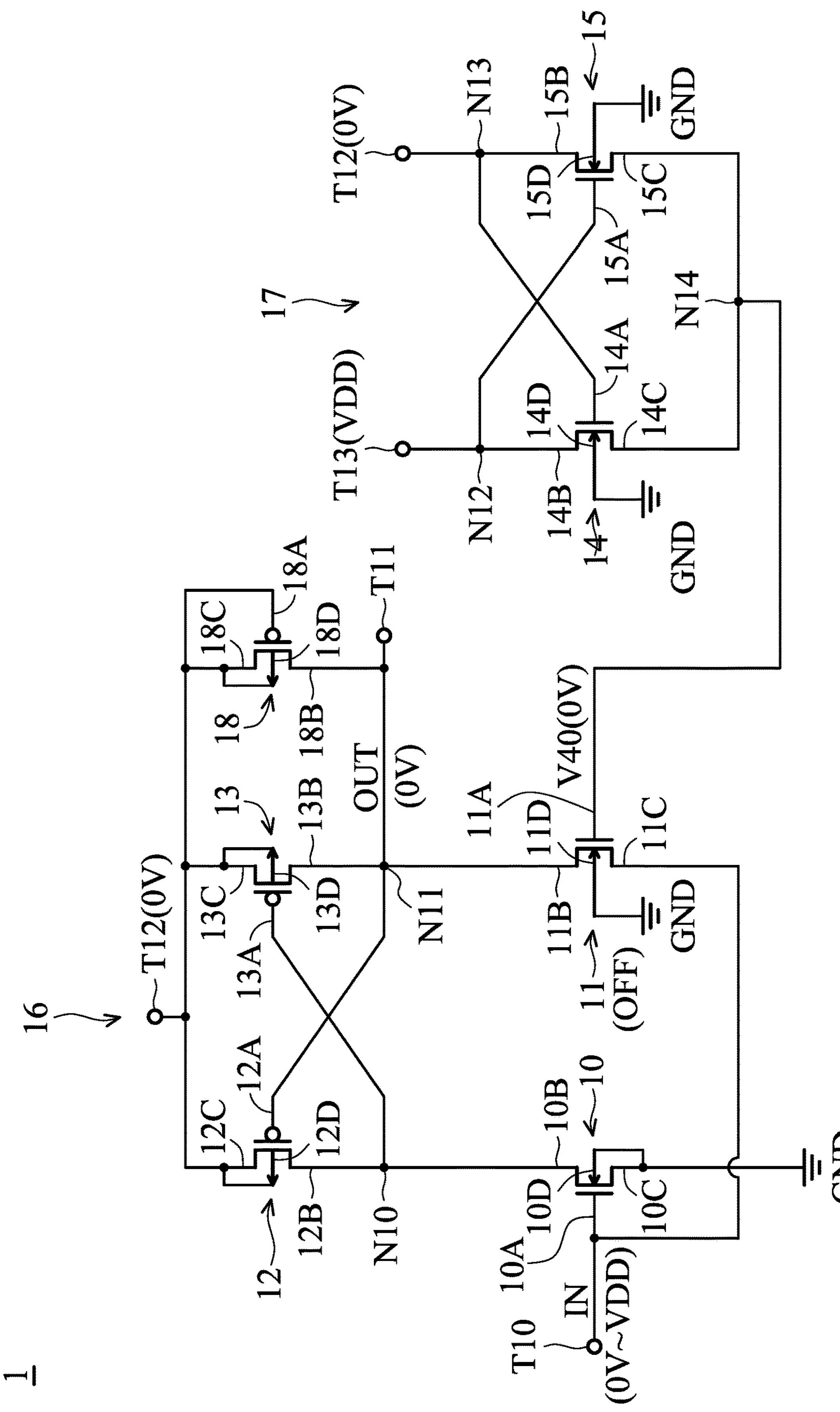
FIG. 4 is a schematic diagram showing an operation of a level shifter in a third mode according to an exemplary embodiment of the present invention.

Referring to FIG. 4, when the level shifter 1 operates in the third mode, the voltage terminal T12 receives a voltage of 0V, and the voltage terminal T13 receives the voltage VDD (1.8V). The case that the voltage terminal T12 receives a voltage of 0V indicates that the voltage terminal T12 does not receive the voltage VDDPST, in other words, the power supply of the power domain where the level shifter 1 is located is turned off. Thus, the voltage of 0V provided to the voltage terminal T12 is the turned-ff voltage corresponding to the turned-off state of the VDDPST power domain. The N-type transistor 14 is turned off according to the voltage of 0V, and the N-type transistor 15 is turned on according to the voltage VDD (1.8V). Through the turned-on N-type transistor 15, a control voltage V40 at the node N14 is close to or equal to 0V. Accordingly, the voltage tracking circuit 17 tracks the voltage of 0V with a lower level among the voltage of 0V at the voltage terminal T12 and the voltage VDD (1.8V) at the voltage terminal T13 to generate the control voltage V40 that is equal to 0V.

The level shifting circuit 16 receives the input signal IN whose voltage level is between 0V and 1.8V (voltage VDD) through the input terminal T10. When the input signal IN is at a voltage level of 0V, the N-type transistor 10 is turned off. Based on the control voltage V40 of 0V, the N-type transistor 11 is turned off (OFF). At this time, the node N11 is in a floating state. Subsequently, through the paths of the leakage currents of the P-type transistors 13 and 18, the voltage at the node N11 is close to or equal to the voltage of 0V at the voltage terminal T12. The output signal OUT of 0V is generated at the output terminal T11 coupled to the node N11.

In the third mode, when the input signal IN is at a voltage level of 1.8V, the N-type transistor 10 is turned on. Through the turned-on N-type transistor 10, the voltage at the node N10 is equal to the voltage (0V) of the ground GND. Based on the control voltage V40 of 0V, the N-type transistor 11 is turned off (OFF). At this time, the P-type transistor 13 is turned on based on the voltage of 0V at the node N10. Through the turned-on P-type transistor 13, the voltage at the node N11 is equal to the voltage of 0V at the voltage terminal T12. The P-type transistor 12 is turned on according to the voltage of 0V at the node N11 so that the node N10 is stably at the voltage level of 0V. The output signal OUT of 0V is generated at the output terminal T11 coupled to the node N11.

According to the above operation, in the third mode, no matter which voltage level between 0V and 1.8V the input signal IN is at, the output signal OUT generated by the level shifter 1 has the voltage level of 0V.

According to the above embodiment, the gate 11A of the pull-down N-type transistor 11 on the output side of the level shifter 1 receives the control voltage generated by the voltage tracking circuit 17. Compared with conventional level shifters, the level shifter 1 of the embodiment does not comprise any inverter, which is in the VDD power domain, at the input terminal T10. That is, the input signal IN received from the input terminal T10 is directly provided to the level shifting circuit 16 without passing through any inverter. Accordingly, in the level shifter 1 of the embodiment, only the N-type well region of the P-type transistors 12, 13, and 18 in the VDDPST power domain is required, thereby reducing the size of the level shifter 1.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter, comprising:
- a level shifting circuit receiving an input signal through an input terminal and converting the input signal from a first power domain to a second power domain to generate an output signal at an output terminal; and
- a voltage tracking circuit, coupled to a first voltage terminal and a second voltage terminal, tracking one with a lower level among a first voltage of the first voltage terminal and a second voltage of the second voltage terminal to generate a control voltage,
- wherein the level shifting circuit comprises:
- a first N-type transistor comprising a gate coupled to the input terminal, a drain coupled to a first node, and a source coupled to a ground; and
- a second N-type transistor comprising a gate receiving the control voltage, a drain coupled to the output terminal at a second node, and a source coupled to the input terminal.

2. The level shifter as claimed in claim 1, wherein all transistors in the voltage tracking circuit are N-type transistors.

3. The level shifter as claimed in claim 1, wherein the voltage tracking circuit comprises:
- a third N-type transistor comprising a gate coupled to the second voltage terminal at a third node, a drain coupled to the first voltage terminal at a fourth node, and a source coupled to a fifth node; and
- a fourth N-type transistor comprising a gate coupled to the fourth node, a drain coupled to the third node, and a source coupled to the fifth node,
- wherein the gate of the second N-type transistor is coupled to the fifth node, and the control voltage is generated at the fifth node.

4. The level shifter as claimed in claim 1 further comprising:
- a first P-type transistor comprising a gate coupled to the second node, a source coupled to the second voltage terminal, and a drain coupled to the first node; and
- a second P-type transistor comprising a gate coupled to the first node, a source coupled to the second voltage terminal, and a drain coupled to the second node.

5. The level shifter as claimed in claim 4, further comprising:
- a third P-type transistor comprising a gate and a source coupled to the second voltage terminal, and a drain coupled to the second node.

6. The level shifter as claimed in claim 1, wherein the first voltage terminal receives a first power voltage of the first power domain as the first voltage, the second voltage terminal receives a second power voltage of the second power domain as the second voltage, and the first voltage is lower than the second voltage.

7. The level shifter as claimed in claim 6, wherein the input signal is provided from the first power domain.

8. The electrostatic discharge protection circuit level shifter as claimed in claim 1, wherein the first voltage terminal receives a turned-off voltage corresponding to a turned-off state of the first power domain as the first voltage, the second voltage terminal receives a power voltage of the second power domain as the second voltage, and the first voltage is lower than the second voltage.

9. The level shifter as claimed in claim 8, wherein the input signal is on a level of 0 volts.

10. The level shifter as claimed in claim 1, wherein the first voltage terminal receives a first power voltage of the first power domain as the first voltage, the second voltage terminal receives a turned-off voltage corresponding to a turned-off state of the second power domain as the second voltage, and the second voltage is lower than the first voltage.

11. The level shifter as claimed in claim 10, wherein the input signal is provided from the first power domain.

12. The level shifter as claimed in claim 1 wherein the level shifting circuit further comprises:

a first P-type transistor comprising a gate, a source coupled to the second voltage terminal, and a drain coupled to the output terminal at the second node.

13. The level shifter as claimed in claim 12, wherein all transistors in the voltage tracking circuit are N-type transistors.

14. The level shifter as claimed in claim 12, wherein the voltage tracking circuit comprises:

a third N-type transistor comprising a gate coupled to the second voltage terminal at a third node, a drain coupled to the first voltage terminal at a fourth node, and a source coupled to a fifth node; and a fourth N-type transistor comprising a gate coupled to the fourth node, a drain coupled to the third node, and a source coupled to the fifth node, wherein the gate of the second N-type transistor is coupled to the fifth node, and the control voltage is generated at the fifth node.

15. The level shifter as claimed in claim 14, wherein the level shifting circuit further comprises:

a second P-type transistor comprising a gate coupled to the second node, a source coupled to the second voltage terminal, and a drain coupled to the first node;

wherein the gate of the first P-type transistor is coupled to the first node.

16. The level shifter as claimed in claim 15, further comprising:

a third P-type transistor comprising a gate and a source coupled to the second voltage terminal, and a drain coupled to the second node.

* * * * *